US009564855B2

(12) United States Patent
Mora-Puchalt (10) Patent No.: US 9,564,855 B2
(45) Date of Patent: Feb. 7, 2017

(54) APPARATUS AND SYSTEM FOR RAIL-TO-RAIL AMPLIFIER

(71) Applicant: Analog Devices Global, Hamilton (BM)

(72) Inventor: Gerard Mora-Puchalt, Catarroja (ES)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/618,899

(22) Filed: Feb. 10, 2015

(65) Prior Publication Data
US 2016/0233833 A1 Aug. 11, 2016

(51) Int. Cl.
*H03F 1/02* (2006.01)
*H03F 3/45* (2006.01)
*H03F 1/30* (2006.01)

(52) U.S. Cl.
CPC ........ *H03F 1/0205* (2013.01); *H03F 3/45179* (2013.01); *H03F 1/303* (2013.01); *H03F 2003/45008* (2013.01); *H03F 2200/231* (2013.01); *H03F 2203/45112* (2013.01); *H03F 2203/45116* (2013.01)

(58) Field of Classification Search
CPC ............ H03F 3/45475; H03F 2200/261; H03F 2203/45116; H03F 3/393; H03F 1/26; H03F 2200/405; H03F 2203/45512; H03F 2203/45544; H03F 3/45179; H03F 1/0205; H03F 2200/411; H03F 2203/45138; H03F 2203/45; H03F 3/45968; H03F 3/387; H03F 2200/372; H03F 2200/375; H03F 2203/45118; H03F 3/45

USPC ........................................................... 330/9
See application file for complete search history.

(56) References Cited

U.S. PATENT DOCUMENTS

| | | | |
|---|---|---|---|
| 4,808,942 A | 2/1989 | Milkovic | |
| 5,479,130 A | 12/1995 | McCartney | |
| 5,841,310 A | 11/1998 | Kalthoff et al. | |
| 6,380,801 B1 * | 4/2002 | McCartney | ........... H03F 3/3064 330/255 |
| 6,665,215 B2 | 12/2003 | Thomas et al. | |
| 6,717,468 B1 | 4/2004 | Jeong et al. | |
| 7,321,261 B2 * | 1/2008 | Felder | ....................... H03F 1/26 330/9 |

(Continued)

OTHER PUBLICATIONS

"Chopper Stabilized (Auto-Zero) Precision Op Amps"; Analog Devices MT-055 Tutorial, Rev. 0, Oct. 2008, WK; pp. 1-6; Copyright 2009.

(Continued)

*Primary Examiner* — Khanh V Nguyen
(74) *Attorney, Agent, or Firm* — Knobbe, Martens, Olson & Bear LLP (57) ABSTRACT

Adaptive biasing circuits for input differential pairs of a buffer or an amplifier adapt to autozero currents for discrete pair selection or continuous pair selection. The adaptive biasing circuits include a multistage device including current source and follower devices with a plurality of switches for a two-phase operation: autozero and amplifying phases. During an autozero phase, input differential pairs are isolated from subsequent stages and biasing currents are determined for autozeroing of input offset voltages. During an amplifying phase, both input differential pairs can be coupled to subsequent stages for continuous selection or a selected input differential pair can be coupled to subsequent stages for discrete selection.

20 Claims, 6 Drawing Sheets

(56) References Cited

U.S. PATENT DOCUMENTS

| | | |
|---|---|---|
| 7,609,112 B2 | 10/2009 | Muller et al. |
| 7,642,846 B2 | 1/2010 | Yan |
| 8,139,792 B2 | 3/2012 | Magrath |
| 8,330,537 B1 * | 12/2012 | Ghorpade ............. H03F 1/0277 330/9 |
| 8,493,139 B2 | 7/2013 | Sayuk |
| 8,576,002 B2 | 11/2013 | Rajasekhar |
| 8,624,668 B2 | 1/2014 | Wan et al. |
| 2010/0045378 A1 | 2/2010 | Steele |
| 2014/0184331 A1 | 7/2014 | Thomsen et al. |

OTHER PUBLICATIONS

Reza Moghimi, "Ask the Applications Engineer-39 Zero-Drift Operational Amplifiers"; Analog Dialogue 44-03 Back Burner, Mar. 2010 pp. 1-2.

* cited by examiner

APPARATUS AND SYSTEM FOR RAIL-TO-RAIL AMPLIFIER

BACKGROUND

Field

The described technology generally relates to electronics, more specifically to rail-to-rail amplifiers.

Description of the Related Art

For certain applications, such as high-precision amplification, it can be desirable for an amplifier to have a relatively low input offset voltage. An amplifier, such as an operational amplifier or instrumentation amplifier, can include chopper circuitry for reducing the amplifier's input offset voltage. To aid in achieving a relatively low input offset voltage, certain amplifiers can use auto-zeroing and/or chopping schemes. A chopper amplifier can have a different input offset in different transistor configurations. For example, prior to chopping, the chopping amplifier can have different amounts of input offset voltage in different transistor configurations. The input offset voltage of the chopper amplifier can change with different transistor configurations due to manufacturing mismatch between transistors, such as manufacturing mismatch associated with process variation.

An amplifier that is designed to drive a switched capacitive load such as the input capacitor of a sigma-delta type of analog to digital convertor (ADC) or a successive approximation register (SAR) type of ADC should have accuracy in output voltage over the full range of inputs and outputs while preserving bandwidth large enough to deliver the output voltage in the allocated sampling period. Furthermore, such an amplifier can incorporate other features such as chopping for low offset and drift, which may benefit from stabilization or auto-zeroing for the chopping mechanism.

SUMMARY

Each of the methods and devices of the described technology has several aspects, no single one of which is solely responsible for its desirable attributes.

One embodiment includes an amplifier having a non-inverting input node, an inverting input node, and at least one output node, the amplifier comprising a first differential pair having a first input and a second input, a second differential pair having a first input and a second input, a first set of chopper switches coupled to inputs of the first differential pair and the second differential pair, a second stage having inputs and the at least one output node, wherein the inputs of the second stage are controllably coupled to the first differential pair and the second differential pair, the second stage including chopper switches, and biasing circuits for the first differential pair and the second differential pair, wherein the biasing circuits are configured to sample an autozero gate voltage during a first phase, wherein the biasing circuits are further configured to hold the autozero gate voltage during a second phase.

Another embodiment includes a method of amplifying an input signal, the method comprising chopping input signals provided to a first differential pair and to a second differential pair, wherein devices of the second differential pair are of complementary type to the devices of the first differential pair, chopping one or more output signals of a second stage, wherein inputs of the second stage are controllably coupled to the first differential pair and to the second differential pair, determining autozero gate voltages during the first phase, and holding the autozero gate voltage for biasing of current source transistors for biasing of the first differential pair and the second differential pair during the second phase.

BRIEF DESCRIPTION OF THE DRAWINGS

These drawings and the associated description herein are provided to illustrate specific embodiments of the described technology and are not intended to be limiting.

DETAILED DESCRIPTION

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Adaptive biasing circuits for input differential pairs of a buffer or an amplifier may adapt to autozero currents for discrete pair selection or continuous pair selection. The adaptive biasing circuits may include a multistage device including current source and follower devices with a plurality of switches for a two-phase operation: autozero and amplifying phases. For discrete pair selection, the adaptive biasing circuits may remove the difference in offsets of complementary input differential pairs, and for continuous pair selection, the adaptive biasing circuits maintain biasing of the input differential pairs over the full input range.

Figure 1A:
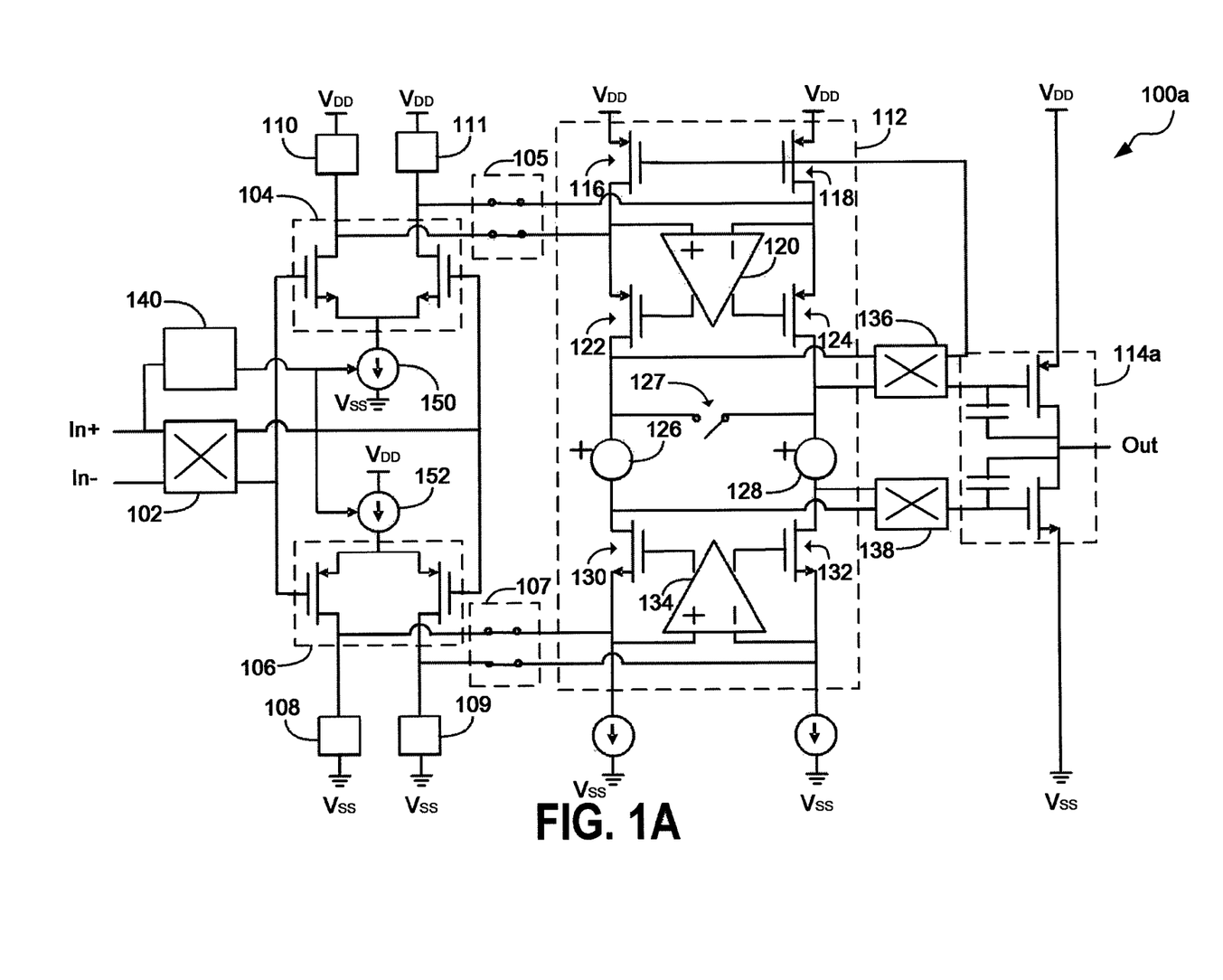
FIG. 1A is a schematic diagram illustrating an example amplifier in accordance with one embodiment.

FIG. 1A is a schematic diagram illustrating an example amplifier 100a in accordance with one embodiment. The illustrated amplifier 100a includes an input chopper 102, complementary input differential pairs 104, 106, biasing circuits 108, 109, 110, 111, interstage switches 105, 107, an amplifier stage 112, output choppers 136, 138, and an output stage 114a. The amplifier 100a further includes a transconductance stabilizer 140 and input differential pair tail current sources 150, 152.

The amplifier stage 112 may include transistors 116, 118, 122, 124, 130, 132 and amplifiers 120, 134 that may form a folded cascode amplifier. The amplifier stage 112 may further include an autozero switch 127, and floating voltage sources 126, 128. A non-inverting input In+ and an inverting input In− of the system 100 can be provided as inputs to the input chopper 102, which can be further coupled to the input differential pairs 104, 106. The input chopper 102 may comprise a plurality of switches to perform chopping of the non-inverting and inverting inputs. The amplifier 100a can be configured as a unity-gain amplifier, in which case, the output node Out is tied to the inverting input node In−. For example, such unity-gain amplifiers can be useful to drive inputs of sigma-delta type or SAR type of ADCs. The floating voltage sources 126, 128 may be configured to bias complementary transistors differently and can be implemented with, for example, a Monticelli circuit or any other appropriate circuit as determined by a person of ordinary skill in the art.

The presence of the two complementary input pairs 104, 106 permits the rail-to-rail operation of input signals at the input nodes In+, In−. When, for example, the input signals are relatively high in voltage (near the positive rail $V_{DD}$), the N-type differential pair 104 is used. When the input signals are relatively low in voltage (near the negative or ground rail $V_{SS}$), the P-type differential pair 106 is used. The switching between the complementary input pairs 104, 106 can be performed in a discrete manner using the interstage switches 105, 107 or in a gradual manner via biasing as described in the following.

In other embodiments, one or both of the non-inverting and the inverting inputs may further be provided as inputs to a comparator (not shown), which is coupled to the interstage switches 105, 107 to select either one of the input differential pairs 104, 106 based on input voltage levels compared to a threshold voltage, for example, $(V_{DD}-V_{SS})/2$ or $V_{DD}/2$ when $V_{SS}$ is ground. In such an embodiment, a discrete input pair selection may be performed, and only one of the input differential pairs 104, 106 may be connected to the amplifier stage 112 at a time for a chop period, for example, as only one of the interstage switches 105, 107 may be closed at a time for sampling during that chop period. A discrete input pair selection may minimize the residual error after chopping the amplifier offset. Embodiments that implement discrete input pair selection may not need to have the transconductance stabilizer 140 illustrated in FIGS. 1A-1B.

In other embodiments, both of the input differential pairs 104, 106 may remain electrically connected to the amplifier stage 112 regardless of input voltage. In such an embodiment, a continuous input pair selection may be performed. In the embodiment implementing a continuous input pair selection, the transition between using the two differential input pairs 104, 106 may happen gradually, which may avoid discontinuities or glitches at the transition point. Embodiments that implement continuous input pair selection may use the transconductance stabilizer 140 illustrated in FIGS. 1A-1B. The transconductance stabilizer 140 may be configured to boost one input differential pair tail current source (e.g., 150) when the other input differential pair tail current source (e.g., 152) is squeezed when the input voltage is too close to a rail voltage, for example. An example implementation of the transconductance stabilizer 140 for the N-type input differential pair 104 is further described in connection with FIG. 3 below.

The biasing circuits 108, 109, 110, 111 may be configured to adapt the current for the input differential pairs 104, 106 so that the input differential pairs 104, 106 can stay properly biased over the full range of inputs to the amplifier 100a. The biasing circuits 110, 111 for the N-type input differential pair 104 can be implemented with devices that are complementary to the devices implementing the biasing circuits 108, 109 for the input differential pair 106. Further details of the biasing circuits 108, 109 are discussed in connection with FIG. 2.

In performing a discrete pair selection, the autozero feature disclosed herein can minimize the offset of the selected input differential pair 104 or 106 and may ameliorate the dynamic glitch at the ADC output that may result from the change in the input differential pair selection. For example, disclosed embodiments may ameliorate the dynamic glitch issue when there is a transition from one input differential pair (e.g., the N-type input differential pair 104) to another (e.g., the P-type input differential pair 106) during a conversion, during which multiple samples can be taken. For instance, disclosed embodiments may remove a step in the envelope of the chopped offset that is observed by the sigma-delta modulator and in turn translated into a digital glitch (e.g., sinc or sin(x)/x) at the output of the ADC.

In performing a continuous input pair selection, the autozero feature disclosed herein can adapt to the current that comes from the drains of the input differential pairs 104, 106 when the input voltage at the input nodes (e.g., In+ or In−) is close to the rails, squeezing the input differential pair tail current sources 150, 152. For example, disclosed embodiments may allow rail-to-rail operation of buffers or amplifiers such as those illustrated in FIGS. 1A-1B, preserving the bandwidth and maintaining a constant systematic offset of the buffers for the full input voltage range, which may provide benefits in various metrics, such as integral nonlinearity (INL) performance. For instance, performing a continuous input pair selection as disclosed herein may resolve sharp transitions or discontinuities and reduce the output error when the common mode voltage is at around $V_{DD}/2$. During chopping, the common mode voltage at the inputs of the amplifiers 100a, 100b may switch between (Vin+Vos)/2 and (Vin−Vos)/2 where Vin is an input voltage (e.g., In+ or In−) and Vos is an offset voltage. The change in the common mode voltage at the inputs may affect the headroom (i.e., drain to source voltage or Vds) of the tail current, which in turn, may affect the accuracy of the chopping mechanism as the difference in tail currents due to the difference in the headroom of the tail current would not be canceled out as a circuit incorporating the amplifier 100a or 100b performs chopping and averaging. Since the autozero feature disclosed herein cancels the input pair offsets, the tail currents will have the same headroom in both chop phases providing the same current in both chop phases, which may remove the residual error after averaging and chopping.

Figure 1B:
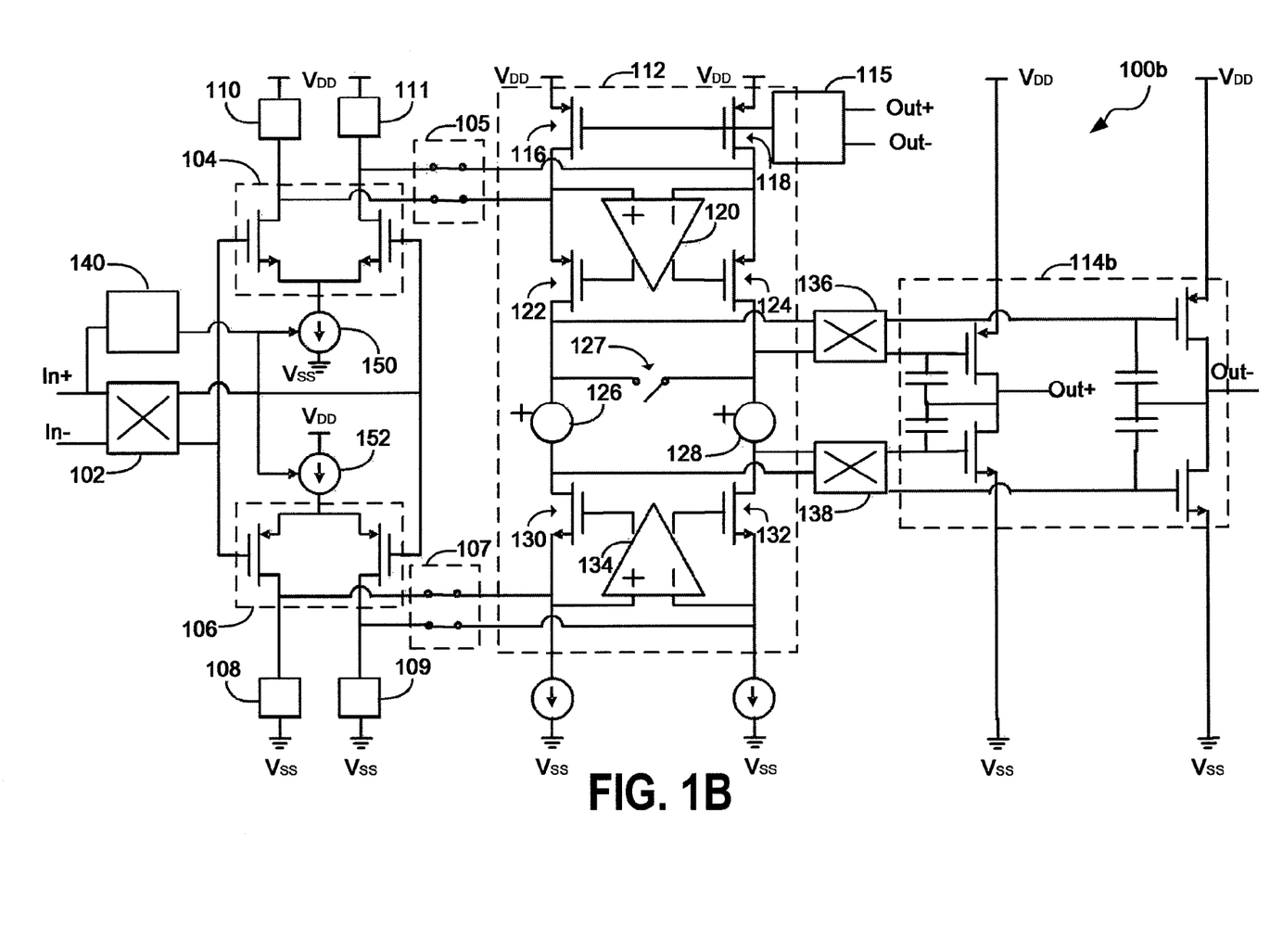
FIG. 1B is a schematic diagram illustrating an example amplifier in accordance with another embodiment.

FIG. 1B is a schematic diagram illustrating another an amplifier in accordance with another embodiment. The illustrated amplifier 100b implements a fully differential amplifier having differential inputs and differential outputs. The illustrated amplifier 100b includes some of the same features discussed in connection with FIG. 1A above as indicated with the same numberings. The amplifier 100b also includes a common mode feedback (CMFB) circuit 115, instead of the feedback from the output chopper 136 to the transistors 116 and 118, and an output stage 114b having differential output nodes Out+ and Out−. The CMFB circuit 115 may be implemented with, for example, a resistor-averaged common mode circuit having a differential amplifier. The CMFB circuit 115 receives signals from the differential output nodes Out+, Out− from the output stage 114b as inputs, determines a common-mode voltage of those signals, and adjusts the biasing of the transistors 116, 118 of the amplifying stage 112 to adjust the common-mode voltage at the differential output nodes Out+, Out−.

The illustrated amplifiers 100a (FIG. 1A) and 100b (FIG. 1B) may function in multiple phases. In particular, the amplifiers 100a, 100b may have an autozero phase 402 (FIGS. 4A-4B) followed by an amplifying phase 404 (FIGS. 4A-4B) at the beginning of one chopping period 401 (FIGS. 4A-4B) of the amplifier. During the autozero phase 402 (FIGS. 4A-4B), the interstage switches 105 and 107 are open and the amplifier stage 112 may stay idle as it is disconnected from the input differential pairs 104 and 106. During the amplifying phase 404 (FIGS. 4A-4B), the amplifier stage 112 may be connected to one or both of the input differential pairs 104, 106. Fewer phases or additional phases can be used. For example, in alternative embodiments, one half of the chopping period 401 can include a first phase with autozero and a second phase with amplifying. For the discrete input pair selection, one of the input differential pairs 104, 106 may be connected to the amplifier stage 112, and for the continuous input pair selection, both of the input differential pairs 104, 106 may be connected to the amplifier stage 112. Further details of the different phases are described in connection with FIGS. 2, 4A-4B below.

In one embodiment, the devices illustrated in FIGS. 1A-3 may be implemented with metal oxide semiconductor (MOS) devices, such as NMOS devices or PMOS devices. While the terms "metal" and "oxide" may be present in, for example, a MOSFET, MOS transistors can have gates made out of materials other than metals, such as polysilicon, and have dielectric oxide regions made from dielectrics other than silicon oxide, such as a high-k dielectric. In another embodiment, the devices illustrated in FIGS. 1A-3 may be implemented with other devices on silicon, compound semiconductor, or any other suitable semiconductor.

Figure 2:
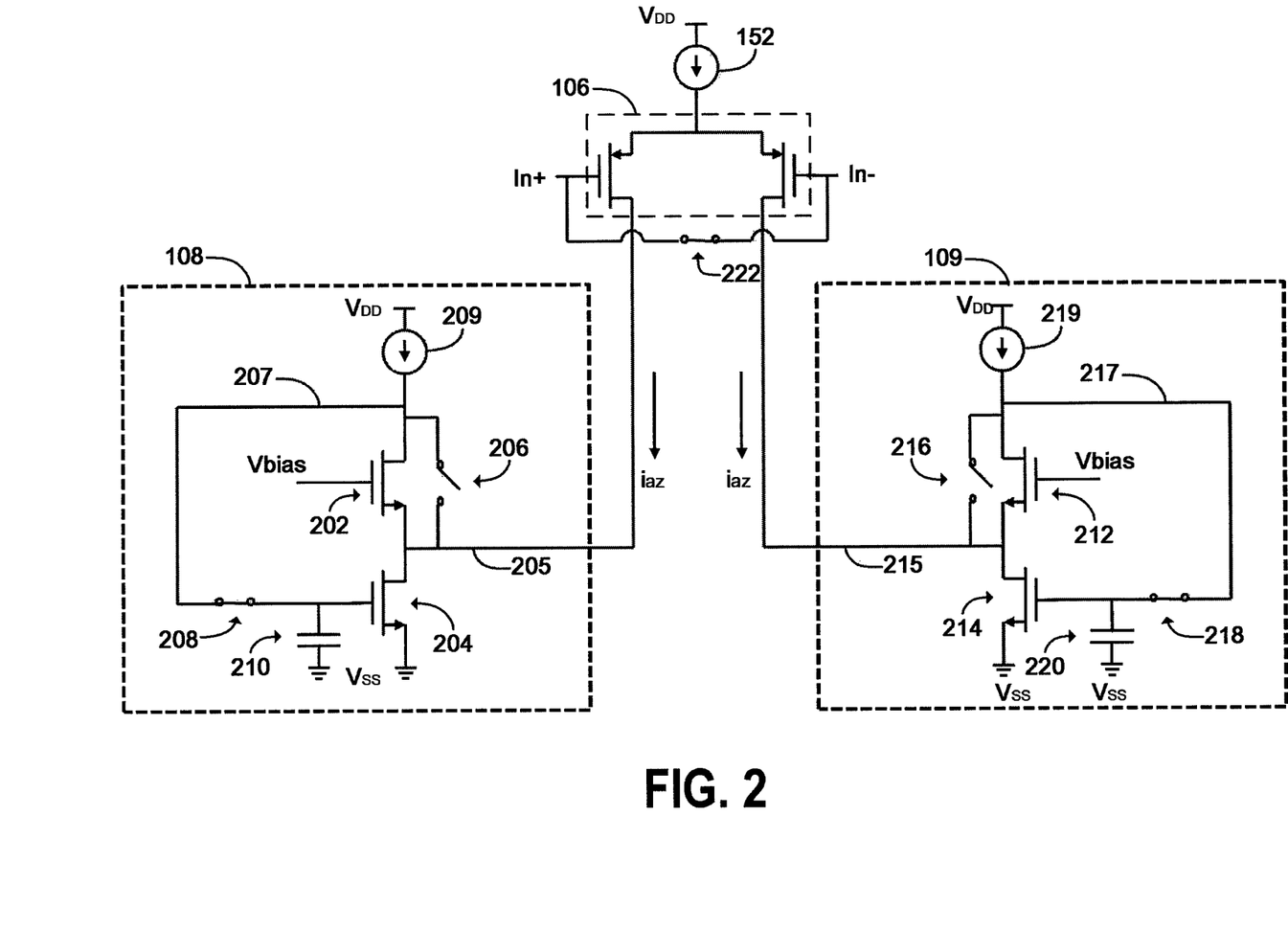
FIG. 2 is a schematic diagram illustrating example biasing circuits in accordance with one embodiment.

FIG. 2 is a schematic diagram illustrating example biasing circuits in accordance with one embodiment. FIG. 2 illustrates parts of the amplifier 100a (FIG. 1A) or 100b (FIG. 1B) in detail, including the input differential pair tail current source 152, the input differential pair 106, and the biasing circuits 108, 109 of FIGS. 1A-1B, and an autozero switch 222. The biasing circuit 108 includes a multistage device comprising transistors 202, 204, a switch 206, an autozero switch 208, a current source 209, and an autozero capacitor 210. Similarly, the biasing circuit 109 includes a multistage device comprising transistors 212, 214, a switch 216, an autozero switch 218, a current source 219, and an autozero capacitor 220.

As illustrated in FIG. 2, the biasing circuits 108, 109 may work as current sources, with the sources of the transistors 204 and 214 connected to ground, and with the gates of the current source transistors 204 and 214 connected to the autozero capacitors 210 and 220 respectively. The autozero switches 208 and 218 may couple the gates of the current source transistors 204 and 214 to the nodes 207 and 217, respectively for autozero functionality. The nodes 207 and 217 illustrated in FIG. 2 can be high impedance nodes as they are connected to the drains of the transistors 202 and 212 and the current sources 209 and 219 respectively. Input nodes 205 and 215 that may accept autozero current, $i_{az}$, from the input differential pair 106 are connected to drains of the current source transistors 204 and 214 respectively, and the sources of the transistors 202 and 212 are also connected to the input nodes 205 and 215 respectively. A bias voltage, Vbias, is applied at the gates of the transistors 206 and 216, which may define the voltage at the respective input nodes 205 and 215 to be, for example, a few hundred millivolts above the saturation voltage Vdsat of the transistors 204 and 214 respectively.

The devices illustrated in FIG. 2 may be implemented with MOS devices of various sizes depending on various design considerations, such as the input and output voltage ranges and the magnitude of autozero currents. For example, the input differential pair tail current source 152, which may be implemented with MOS devices, may be sized at 10 times the current sources 209 and 219, while the transistors 204 and 214 may be sized at 6 times the current sources 209 and 219. Other geometries will be readily determined by one of ordinary skill in the art.

During an autozero phase 402 (FIGS. 4A-4B), the switches 206 and 216 are open, and the autozero switches 208, 218, and 222 are closed, connecting the gates of the transistors 204 and 214 to the nodes 207 and 217 respectively, and connecting the nodes for the inverting input In−, and the non-inverting input In+ as shown as illustrated in FIG. 2. The autozero phase in FIG. 2 operates as follows. The closure of the switch 222 forces the input voltages at the non-inverting input node In+ and the inverting input node In− to be the same. Accordingly, equal currents $i_{az}$ should flow through the drains of each transistor of the P-type input differential pair 106. For the transistor 204, the drain current is the sum of the current $i_{az}$ from the P-type input differential pair 106 and the current from the current source 209 via the transistor 202. The drain-to-source voltage drop $V_{DS}$ of the transistor 202 provides headroom for the gate-to-source voltage of the transistor 204. With the switch 208 closed, the gate-to-source voltage $V_{GS}$ of the transistor 204 settles to a level corresponding to the current $i_{az}$ plus the current from the current source 209. This gate-to-source voltage $V_{GS}$ is also stored across the capacitor 210 so that the autozero voltage is stored. When the autozero phase is over, the switch 208 is opened, the switch 206 is closed, and the switch 222 is opened. With the switch 208 opened, the charge on the capacitor 210 maintains the autozero gate-to-source voltage $V_{GS}$ on the gate of the transistor 204. The closure of the switch 206 permits a path for the current from the current source 209 to flow to the drain of the transistor 204. Finally, the opening of the switch 222 permits normal operation of the P-type input differential pair 106. One advantage of the illustrated biasing circuit 108 over, for example, a conventional biasing circuit in which the biasing circuit 108 could be replaced by a diode-connected transistor is increased headroom. With a diode-connected transistor, the drain-to-source voltage will be limited by the gate-to-source voltage, whereas the biasing circuit 108 is not so limited. The biasing circuit 109 can operate in a like manner as described for the biasing circuit 108. The high impedance nodes 207 and 217, which are connected to the drains of the transistors 202 and 212 and the current sources 209 and 219 respectively, and, in turn, the gates of the transistors 204 and 214 may adapt to accept the autozero current, $i_{az}$, from the input differential pair 106 as the respective input nodes 205 and 215 are properly biased with the respective transistors 202 and 212. During the autozero phase 402 (FIGS. 4A-4B), autozero voltage is stored across the autozero capacitors 210 and 220. Additional details of the autozero phase 402 (FIGS. 4A-4B) are further described in connection with FIGS. 4A-4B below.

During the amplifying phase 404 (FIGS. 4A-4B), the autozero switches 208, 218, and 222 are open, disconnecting the drains of the transistors 202 and 212 from the gates of the transistors 204 and 214 respectively and disconnecting the inverting input node In− from the non-inverting input node In+. Also during the amplifying phase, the switches 206 and 216 are closed, connecting the drains of the transistors 202 and 212 to the input nodes 205 and 215 respectively. By closing the switches 206 and 216, voltages at the respective nodes 207 and 217 can be defined and the current flow from the current sources 209 and 219 can be preserved. As the autozero voltage stored across the autozero capacitors 210 and 220 during the autozero phase may drive the gates of the transistors 204 and 214 respectively, the transistors 204 and 214 may accept the current flow from the current sources 209 and 219 and the input nodes 205 and 215 respectively during the amplifying phase. Additional details of the amplifying phase 404 (FIGS. 4A-4B) are further described in connection with FIGS. 4A-4B below.

Similar to how the biasing circuits 108, 109 for the input differential pair 106 can be implemented as illustrated in FIG. 2, the biasing circuits 110, 111 (FIGS. 1A-1B) for the input differential pair 104 (FIGS. 1A-1B) can be implemented with devices that are complementary to the devices used in the biasing circuits 108, 109. For example, the biasing circuits 110, 111 (FIGS. 1A-1B) may be implemented with PMOS transistors instead of NMOS transistors.

Figure 3:
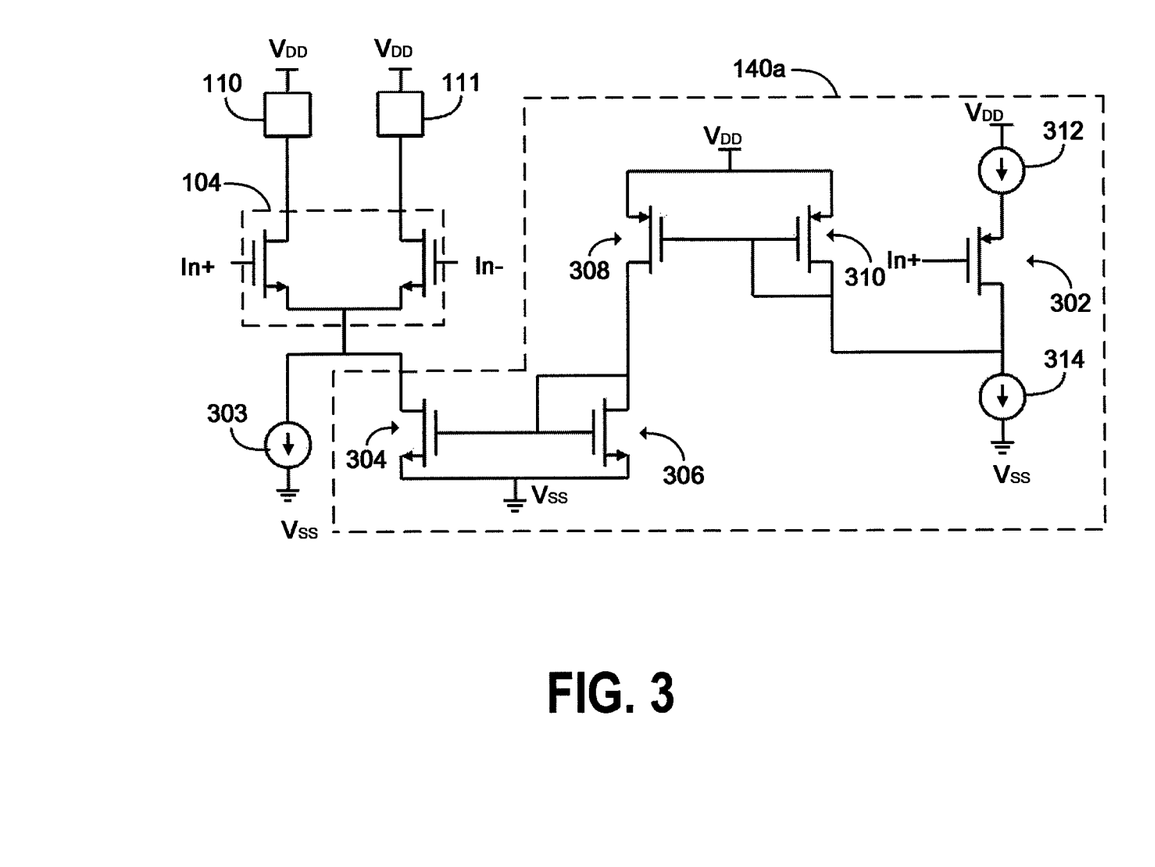
FIG. 3 is a schematic diagram illustrating an example transconductance stabilization circuit in accordance with one embodiment.

FIG. 3 is a schematic diagram illustrating an example transconductance stabilization circuit in accordance with one embodiment. FIG. 3 illustrates parts of the amplifier 100a (FIG. 1A) or 100b (FIG. 1B) in detail, including the biasing circuits 110, 111, the input differential pair 104, and a partial implementation of the transconductance stabilizer 140 of FIGS. 1A-1B. The transconductance stabilizer 140 of FIGS. 1A-1B may include stabilizing circuits for both of the input differential pairs 104 and 106 (FIGS. 1A-1B). In FIG. 3, an example stabilizing circuit for the input differential pair 104 is illustrated. The transconductance stabilizer 140a for the input differential pair 104 can be implemented using a replica device to sense the input voltage, and the transconductance stabilizer 140a may include current mirror transistors 304, 306, 308, and 310, an input pair replica device 302, and current sources 303, 312, and 314. For example, the input differential pair tail current source 150 (FIG. 1) can be implemented by the current source 303 and the current source 304. As illustrated in FIG. 3, the input pair replica device 302 may be a device that is complementary (e.g., PMOS) to the devices of the N-type input differential pair 104 (e.g., NMOS). The input pair replica device 302 may accept the signal at the non-inverting input node In+ as illustrated in FIG. 3. In one embodiment, the current sources 312 and 314 can source and sink about equal amounts of current, the current mirror transistors 304, 306, can be about equally sized, and the current mirror transistors 308, 310 can be equally sized.

During certain operating conditions, the biasing current from the input differential pair 104 may be equally shared between the current source 303 and the current mirror transistor 304 for the boosted case, but other configurations are possible. The current source 303 provides a normal amount of tail current for biasing, and the current mirror transistor 304 can provide a boost for transconductance $g_m$ stabilization. When both of the complementary input differential pairs 104, 106 are connected in the continuous pair selection configuration or mode, the overall transconductance $g_m$ can be the sum of the two transconductances. However, the tail currents for the complementary input differential pairs 104, 106 can become squeezed due to lack of headroom when operating near rail voltages, resulting in loss of transconductance. For example, the N-type input differential pair 104 can become squeezed with input voltages near to $V_{SS}$. Similarly, the P-type input differential pair 106 can become squeezed with input voltages near to $V_{DD}$. So, for example, with an input voltage at the non-inverting input node In+ near to $V_{DD}$, the P-type input differential pair 106 becomes squeezed and loses transconductance. At the same time, the replica transistor 302 also becomes squeezed, which reduces current flow from the replica transistor 302 that is sunk by the current source 314, which forces more current to flow through the diode-connected transistor 310. This increases the flow through the mirror transistor 308, which increases the flow through the diode-connected transistor 306, which increases the flow through the mirror transistor 304, which boosts the tail current of the N-type input differential pair 104, which results in relatively constant transconductance with input voltages near $V_{DD}$.

Similar to how the transconductance stabilizer 140a for the input differential pair 104 can be implemented as illustrated in FIG. 3, a transconductance stabilizer for the P-type input differential pair 106 (FIGS. 1A-1B) can be implemented using devices complementary to the ones used in the transconductance stabilizer 140a. For example, a transconductance stabilizer for the input differential pair 106 (FIGS. 1A-1B) may use an NMOS device as an input pair replica device, accepting the non-inverting input In+(FIGS. 1A-1B). Having a complementary stabilizer circuit as described above may allow an overlap of transconductance ($g_m$), which may maintain the total transconductance relatively constant, which helps to prevent loss of bandwidth.

With the transconductance stabilizer 140 (FIGS. 1A-1B) implemented as partially illustrated in FIG. 3, the disclosure herein can boost tail current to keep constant total transconductance ($g_m$) over the full input range. For example, when the input differential pair tail current source 152 (FIGS. 1A-1B) is squeezed, the transconductance stabilizer 140a may be used to boost the current through the input differential pair tail current source 150 (FIGS. 1A-1B).

Figure 4A:
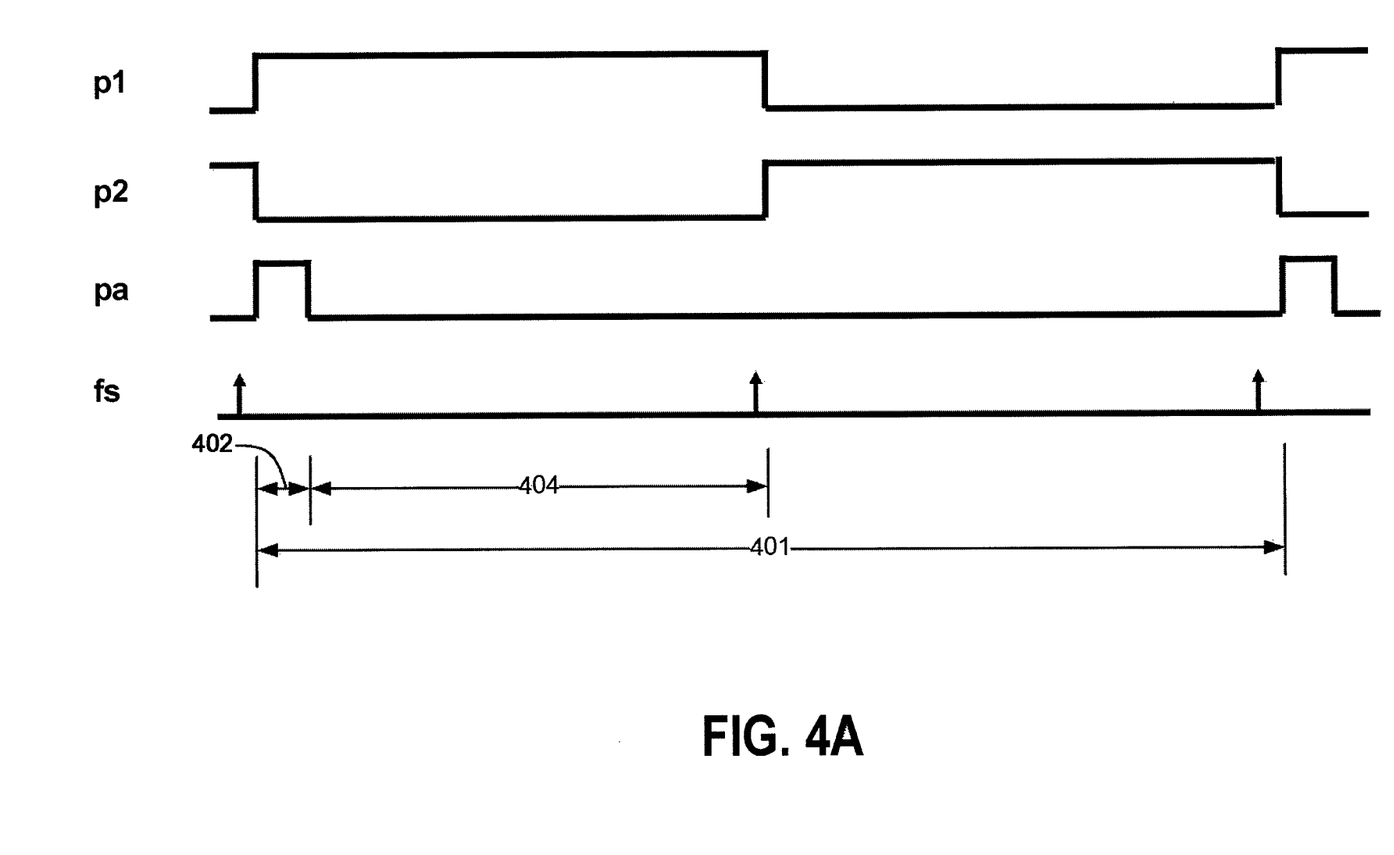
FIG. 4A is a timing diagram illustrating example operational phases in accordance with one embodiment.

FIG. 4A is a timing diagram illustrating example operational phases in accordance with one embodiment. The diagram in FIG. 4A illustrates chopping switch signals p1, p2, an autozero switch signal pa, and a sampling frequency, fs. The periods of the chopping switch signals p1, p2 determines the chopping period 401. In this example, the period of high autozero switch signal pa determines the autozero phase 402, and the remaining duration of half of the chopping period is the amplifying phase 404. The autozero switch signal pa may be provided as a control to the autozero switches 222, 208, and 218 of FIG. 2, and an inverse of the autozero switch signal may be provided as a control to the switches 206 and 216 of FIG. 2. Also, in an example application of the disclosed herein implemented with an ADC stage following the amplifier 100a or the amplifier 100b, ADC sampling may be taken at near the end of the amplifying period 404 and near the end of each half of the chopping period 401 as illustrated in FIG. 4A. In some embodiments, the ADC stage can be implemented with an oversampling ADC. In the illustrated example of FIG. 4A, the autozero period is same as the chopping period 401. As further discussed below in connection with FIG. 4B, the chopping, sampling, and autozero period/frequency may vary relative to one another in alternative embodiments.

Figure 4B:
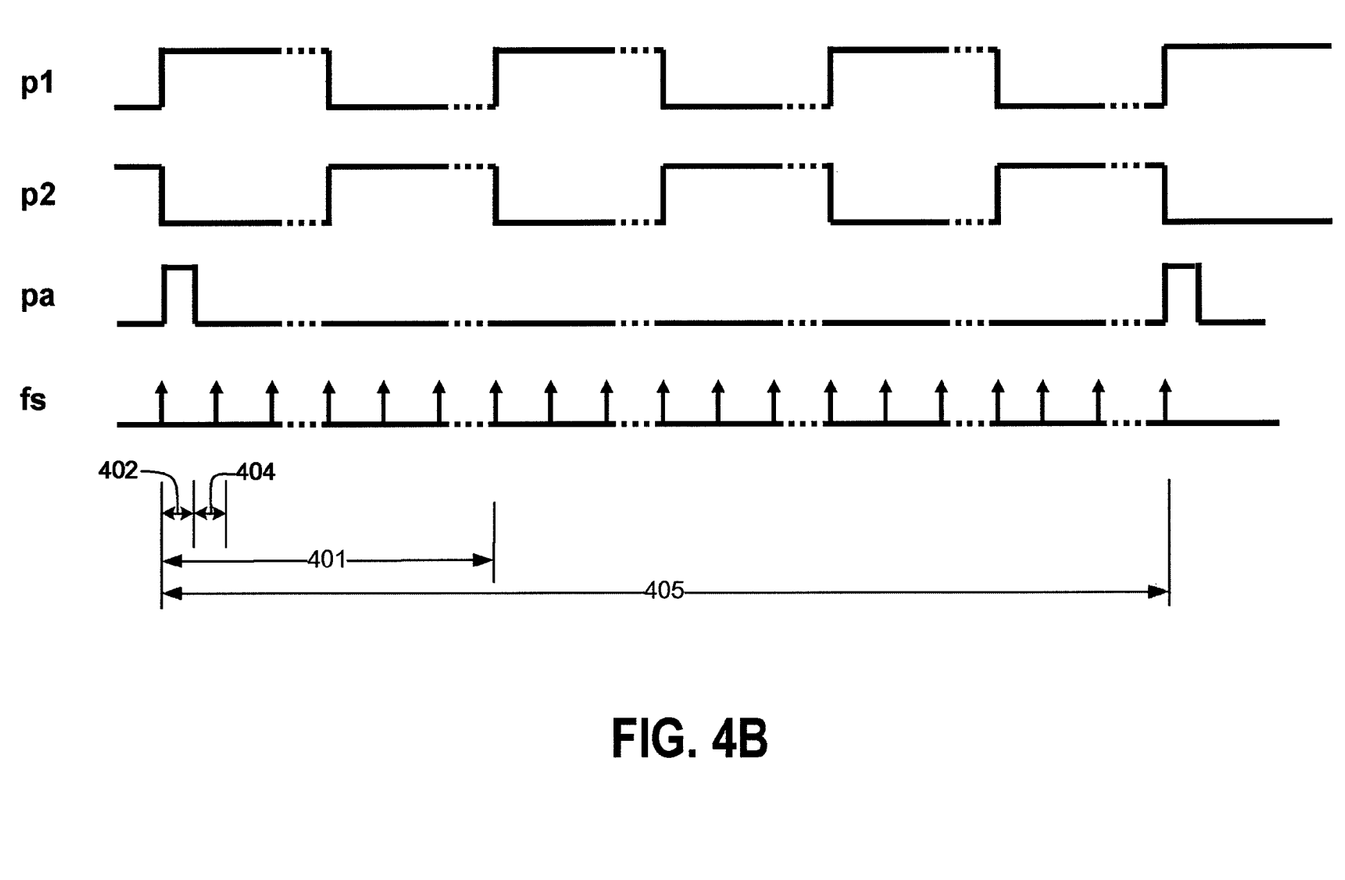
FIG. 4B is a timing diagram illustrating example operational phases in accordance with another embodiment.

FIG. 4B is a timing diagram illustrating example operational phases in accordance with another embodiment. Similar to FIG. 4A, chopping switch signals p1, p2, an autozero switch signal pa, and a sampling frequency, fs, are illustrated in FIG. 4B. The autozero features disclosed herein can be implemented with a chopping frequency greater than or equal to an autozero frequency and a sampling frequency greater than or equal to twice the chopping frequency. Accordingly, as illustrated in FIG. 4B in some embodiments, there can be multiple cycles of chopping within an autozero period 405, and within one chopping period 401, there can be multiple points of sampling to the extent allowable with the durations of the autozero phase 402 and the amplifying phase 404.

The durations of the periods illustrated in FIGS. 4A-4B may be determined based on multiple factors such as the ADC sampling frequency, the ADC output data rate, or the amplifier flicker noise. For example, an embodiment with a chopping amplifier with the chopping frequency of 200 kHz, may have the duration of the chopping period 401 of 5 μs, the amplifying period 404 of 1.875 μs, and the duration of the autozero period 402 of 625 ns.

The systems, apparatus, and/or methods discussed herein can be implemented in various electronic devices. Examples of the electronic devices can include, but are not limited to, consumer electronic products, parts of the consumer electronic products, electronic test equipment, wireless communications infrastructure such as base stations, automotive electronics, industrial electronics, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a wrist watch, a clock, etc. Further, the electronic device can include unfinished products.

Unless the context clearly requires otherwise, throughout the description and the clauses, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other apparatus, not necessarily the apparatus described above. The elements and acts of the various embodiments described above can be combined to provide further embodiments.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure.

What is claimed is:

1. An amplifier having a non-inverting input node, an inverting input node, and at least one output node, the amplifier comprising:
a first differential pair having a first input and a second input;
a second differential pair having a first input and a second input;
a first set of chopper switches coupled to inputs of the first differential pair and the second differential pair;
a second stage having inputs and the at least one output node, wherein the inputs of the second stage are controllably coupled to the first differential pair and the second differential pair, the second stage including chopper switches; and
biasing circuits for the first differential pair and the second differential pair, wherein the biasing circuits are configured to store an autozero gate voltage during a first phase, wherein the biasing circuits are further configured to maintain the autozero gate voltage during a second phase.

2. The amplifier of claim 1, wherein the at least one output node is tied to the inverting input node such that the differential amplifier is configured as a unity-gain buffer.

3. The amplifier of claim 1, wherein the at least one output node is connected to an oversampling analog-to-digital converter (ADC), wherein the oversampling ADC is configured to sample a signal of the at least one output node at least at an end of the second phase.

4. The amplifier of claim 1, further comprising interstage switches disposed in signal paths between the first differential pair and a subsequent amplification stage and in signal paths between the second differential pair and the subsequent amplification stage, wherein the isolation switches are configured to disconnect both the first differential pair and the second differential pair from the subsequent amplification stage during the first phase and connect a selected one of the first differential pair or the second differential pair during the second phase.

5. The amplifier of claim 1, further comprising interstage switches disposed in signal paths between the first differential pair and a subsequent amplification stage and in signal paths between the second differential pair and the subsequent amplification stage, wherein the isolation switches are configured to disconnect both the first differential pair and the second differential pair from the subsequent amplification stage during the first phase and connect both the first differential pair and the second differential pair during the second phase.

6. The amplifier of claim 1, wherein each of the biasing circuits comprises:
   an autozero capacitor; and
   a multistage device configured to:
      bias current for one of the inputs of the first or second differential pair; and
      charge the autozero capacitor.

7. The amplifier of claim 6, wherein an input node of the multistage device is configured to bias current for one of the inputs of the differential pairs.

8. The amplifier of claim 7, wherein each of the biasing circuits further comprises:
   an autozero switch configured to define a voltage output of the multistage device during an autozero phase; and
   a second switch configured to define the voltage output of the multistage device during an amplifying phase.

9. The amplifier of claim 6, wherein the multistage device comprises a source of a first transistor configured to buffer current and a drain of a second transistor configured to source current through an input node of the multistage device.

10. The amplifier of claim 9, further comprising:
    a differential pair current source for each of the differential pairs; and
    wherein each of the biasing circuits further comprises a biasing circuit current source.

11. The amplifier of claim 1, wherein the amplifier comprises a folded cascode amplifier.

12. The amplifier of claim 1, wherein the amplifier comprises a multistage amplifier.

13. The amplifier of claim 1, further comprising a transconductance stabilizer.

14. The amplifier of claim 1, wherein the amplifier is a fully differential amplifier comprising two output nodes.

15. The amplifier of claim 1, further comprising:
    a first current source configured to provide a tail current of the first differential pair, the first current source configured to boost the tail current of the first differential pair when biasing conditions of the second differential pair results in a reduction in transconductance of transistors of the second differential pair; and
    a second current source configured to provide a tail current of the second differential pair, the second current source configured to boost the tail current of the second differential pair when biasing conditions of the first differential pair results in a reduction in transconductance of transistors of the first differential pair.

16. A method of amplifying an input signal, the method comprising:
    chopping input signals provided to a first differential pair and to a second differential pair, wherein devices of the second differential pair are of complementary type to the devices of the first differential pair;
    chopping one or more output signals of a second stage, wherein inputs of the second stage are controllably coupled to the first differential pair and to the second differential pair;
    receiving an autozero gate voltage during the first phase; and
    maintaining the autozero gate voltage for biasing of current source transistors for biasing of the first differential pair and the second differential pair during the second phase.

17. The method of claim 16, further comprising sampling one or more output signals by an oversampling analog-to-digital converter (ADC) at least at an end of the second phase.

18. The method of claim 16, further comprising electrically disconnecting both the first differential pair and the second differential pair from a second stage during the first phase and electrically connecting both the first differential pair and the second differential pair during the second phase.

19. The method of claim 16, further comprising electrically disconnecting both the first differential pair and the second differential pair from a second stage during the first phase and electrically connecting a selected one of the first differential pair or the second differential pair during the second phase.

20. The method of claim 16, further comprising:
    boosting a tail current of the first differential pair when biasing conditions of the second differential pair results in a reduction in transconductance of transistors of the second differential pair; and
    boosting a tail current of the second differential pair when biasing conditions of the first differential pair results in a reduction in transconductance of transistors of the first differential pair.

* * * * *